(12) United States Patent
Cheng

(10) Patent No.: US 12,256,499 B2
(45) Date of Patent: Mar. 18, 2025

(54) DRIVER SUBSTRATE AND DISPLAY PANEL

(71) Applicant: TCL CHINA STAR OPTOELECTRONICS TECHNOLOGY CO., LTD., Shenzhen (CN)

(72) Inventor: Xi Cheng, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/296,237

(22) PCT Filed: Apr. 20, 2021

(86) PCT No.: PCT/CN2021/088377
§ 371 (c)(1),
(2) Date: Oct. 13, 2022

(87) PCT Pub. No.: WO2022/213422
PCT Pub. Date: Oct. 13, 2022

(65) Prior Publication Data
US 2024/0032206 A1    Jan. 25, 2024

(30) Foreign Application Priority Data
Apr. 7, 2021    (CN) .......................... 202110371928.0

(51) Int. Cl.
*H05K 1/02*    (2006.01)
*H05K 3/28*    (2006.01)

(52) U.S. Cl.
CPC ............... *H05K 3/28* (2013.01); *H05K 1/028* (2013.01); *H05K 2201/10128* (2013.01)

(58) Field of Classification Search
CPC . H05K 3/28; H05K 1/028; H05K 2201/10128
(Continued)

(56) References Cited

U.S. PATENT DOCUMENTS 11,460,738 B2 *    10/2022    Tezen ................. G02F 1/133305
2020/0214137 A1 *    7/2020    Huang ................. H05K 1/0281

FOREIGN PATENT DOCUMENTS

CN    202151001 U    2/2012
CN    102956154 A    3/2013
(Continued)

OTHER PUBLICATIONS

Chinese Office Action issued in corresponding Chinese Patent Application No. 202110371928.0 dated Mar. 28, 2022, pp. 1-8.
(Continued)

*Primary Examiner* — Binh B Tran
(74) *Attorney, Agent, or Firm* — PV IP PC; Wei Te Chung

(57) ABSTRACT

A driver substrate and a display panel are disclosed. The driver substrate includes a base substrate and a flexible circuit board. The base substrate has a first bonding portion. The flexible circuit board is disposed on a bonding surface of the first bonding portion and bends from the bonding surface to a side of the first bonding portion away from the bonding surface. The flexible circuit board includes a bent portion, an anti-scratch structure is disposed between the bent portion and the first bonding portion, and the bent portion is attached to the anti-scratch structure.

20 Claims, 3 Drawing Sheets

(58) Field of Classification Search
USPC .......................................................... 361/749
See application file for complete search history.

(56) References Cited

FOREIGN PATENT DOCUMENTS

| | | |
|---|---|---|
| CN | 205830139 U | 12/2016 |
| CN | 206363042 U | 7/2017 |
| CN | 206497269 U | 9/2017 |
| CN | 108008584 A | 5/2018 |
| CN | 108052233 A | 5/2018 |
| CN | 109147564 A | 1/2019 |
| CN | 110610904 A | 12/2019 |
| CN | 111182775 A | 5/2020 |
| CN | 111413834 A | 7/2020 |
| KR | 101307260 B1 | 9/2013 |
| KR | 20190119244 A | 10/2019 |

OTHER PUBLICATIONS

International Search Report in International application No. PCT/CN2021/088377, mailed on Jan. 10, 2022.
Written Opinion of the International Searching Authority in International application No. PCT/CN2021/088377, mailed on Jan. 10, 2022.

\* cited by examiner

DRIVER SUBSTRATE AND DISPLAY PANEL

RELATED APPLICATIONS

This application is a Notional Phase of PCT Patent Application No. PCT/CN2021/088377 having international filing date of Apr. 20, 2021, which claims the benefit of priority of Chinese Patent Application No. 202110371928.0 filed on Apr. 7, 2021. The contents of the above applications are all incorporated by reference as if fully set forth herein in their entirety.

BACKGROUND OF INVENTION

1. Field of Invention

The present invention relates to a technical field of displays and particularly to a driver substrate and a display panel.

2. Related Art

In response to higher and higher requirements for image quality in the high-end television (TV) market, improving display picture quality has become a new demand for high-end TVs. At present, 8K organic light-emitting diodes (OLEDs) still need to be developed because of limitations from problems such as compensation circuits, backplane technologies, and driver design. As a new display technology, mini light-emitting diodes (mini LEDs) or micro LEDs have remarkable advantages over OLEDs in terms of brightness and power consumption.

Since mini/micro LED backplanes currently only support small-sized display panel applications, when they are used as backlights of large-sized TVs (60 inches, 75 inches, etc.), multiple backplanes are often required to be spliced together. With development of large-sized splicing technologies, demand for seamless splicing is becoming more and more urgent. Therefore, a narrow border splicing technology was created. Especially in applications of glass-based mini/micro LEDs, flexible circuit boards need to be adhered to the back of glass substrates by bypassing edges of the glass, and bent portions of the flexible circuit boards are exposed to risk of being scratched by the edges of the glass, which will cause poor display in severe cases.

SUMMARY OF INVENTION

An object of the present invention is to provide a driver substrate and a display panel to overcome a technical problem that flexible circuit boards in current mini/micro light-emitting diode (LED) backplanes are easily scratched by edges of glass.

An embodiment of the present application provides a driver substrate, comprising a base substrate comprising a first bonding portion; and a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure.

Optionally, in some embodiments of the present application, a surface of the anti-scratch structure adjacent to the bent portion is a curved surface.

Optionally, in some embodiments of the present application, the surface of the anti-scratch structure adjacent to the bent portion is an arc surface.

Optionally, in some embodiments of the present application, the anti-scratch structure comprises a first anti-scratch portion and a second anti-scratch portion, and the second anti-scratch portion is located at a side of the first anti-scratch portion adjacent to the bent portion; wherein a recess is defined on a side of the first anti-scratch portion adjacent to the second anti-scratch portion, the second anti-scratch portion is filled in the recess, the bent portion is attached to the second anti-scratch portion, and the second anti-scratch portion has an elastic modulus less than an elastic modulus of the first anti-scratch portion.

Optionally, in some embodiments of the present application, the anti-scratch structure comprises a first anti-scratch portion of which a surface adjacent to the bent portion is a flat surface, wherein the flat surface adjoins the bonding surface and is located at an angle greater than 90 degrees and less than 180 degrees with respect to the bonding surface.

Optionally, in some embodiments of the present application, the anti-scratch structure comprises a second anti-scratch portion disposed over the flat surface of the first anti-scratch portion, the bent portion is attached to the second anti-scratch portion, and the second anti-scratch portion has an elastic modulus less than an elastic modulus of the first anti-scratch portion.

Optionally, in some embodiments of the present application, the first anti-scratch portion and the base substrate are in integral formation with each other.

Optionally, in some embodiments of the present application, the anti-scratch structure comprises a base portion and an anti-scratch portion, wherein the base portion and the base substrate are in integral formation with each other, the anti-scratch portion is disposed on a side of the base portion adjacent to the bent portion, the bent portion is attached to the anti-scratch portion, and the anti-scratch portion has an elastic modulus less than an elastic modulus of the base portion.

Optionally, in some embodiments of the present application, the anti-scratch portion is a lubricating layer.

Optionally, in some embodiments of the present application, the base portion has a transition surface adjoining the bonding surface, and the anti-scratch portion covers the transition surface and bends from the transition surface to a side of the base portion.

Optionally, in some embodiments of the present application, the flexible circuit board further comprises a second bonding portion disposed on the bonding surface and adjoining the bent portion, wherein the anti-scratch portion gradually increases in thickness on the transition surface in a direction perpendicular to a plane on which the bonding surface is located, and in a direction away from the second bonding portion to close to the second bonding portion.

An embodiment of the present application provides a driver substrate, comprising a base substrate comprising a first bonding portion; and a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure; a driver chip disposed on a side of the first bonding portion away from the bonding surface and located at an end of the flexible circuit board; and an external circuit board disposed on the side of the first bonding portion away from the bonding surface and configured to transmit control signals to the flexible circuit board.

An embodiment of the present application further provides a display panel, comprising a driver substrate, wherein the driver substrate comprises a base substrate comprising a first bonding portion; and a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure.

Optionally, in some embodiments of the present application, a surface of the anti-scratch structure adjacent to the bent portion is a curved surface.

Optionally, in some embodiments of the present application, the anti-scratch structure comprises a first anti-scratch portion and a second anti-scratch portion, and the second anti-scratch portion is located at a side of the first anti-scratch portion adjacent to the bent portion; wherein a recess is defined on a side of the first anti-scratch portion adjacent to the second anti-scratch portion, the second anti-scratch portion is filled in the recess, the bent portion is attached to the second anti-scratch portion, and the second anti-scratch portion has an elastic modulus less than an elastic modulus of the first anti-scratch portion.

Optionally, in some embodiments of the present application, the anti-scratch structure comprises a first anti-scratch portion of which a surface adjacent to the bent portion is a flat surface, wherein the flat surface adjoins the bonding surface and is located at an angle greater than 90 degrees and less than 180 degrees with respect to the bonding surface.

Optionally, in some embodiments of the present application, the anti-scratch structure comprises a second anti-scratch portion disposed over the flat surface of the first anti-scratch portion, the bent portion is attached to the second anti-scratch portion, and the second anti-scratch portion has an elastic modulus less than an elastic modulus of the first anti-scratch portion.

Optionally, in some embodiments of the present application, the anti-scratch structure comprises a base portion and an anti-scratch portion, wherein the base portion and the base substrate are in integral formation with each other, the anti-scratch portion is disposed on a side of the base portion adjacent to the bent portion, the bent portion is attached to the anti-scratch portion, and the anti-scratch portion has an elastic modulus less than an elastic modulus of the base portion.

Optionally, in some embodiments of the present application, the base portion has a transition surface adjoining the bonding surface, and the anti-scratch portion covers the transition surface and bends from the transition surface to a side of the base portion.

Optionally, in some embodiments of the present application, the flexible circuit board further comprises a second bonding portion disposed on the bonding surface and adjoining the bent portion, wherein the anti-scratch portion gradually increases in thickness on the transition surface in a direction perpendicular to a plane on which the bonding surface is located, and in a direction away from the second bonding portion to close to the second bonding portion.

The present application has advantageous effects as follows: compared to driver substrates in the prior art, a driver substrate provided by the present application employs an anti-scratch structure disposed between a bent portion of a flexible circuit board and a first bonding portion of a base substrate and makes the bent portion attached to the anti-scratch structure, so as to reduce the risk of scratches caused by a direct contact between the bent portion of the flexible circuit board and the base substrate, thereby improving the situation of poor display caused by damage to the flexible circuit board.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

An embodiment of the present application provides a driver substrate and a display panel, and the detailed description is given below. It should be noted that the order of description in the following embodiments is not meant to limit the preferred order of the embodiments.

It should be noted that in this application, the driver substrate may be a mini/micro light-emitting diode (LED) backplane for mini/micro LED display. The driver substrate may also be an array substrate for liquid crystal display or organic light-emitting diode display. The following embodiments of this application only take the structure when the driver substrate is a mini/micro LED backplane as an example but is not limited thereto.

Figure 1:
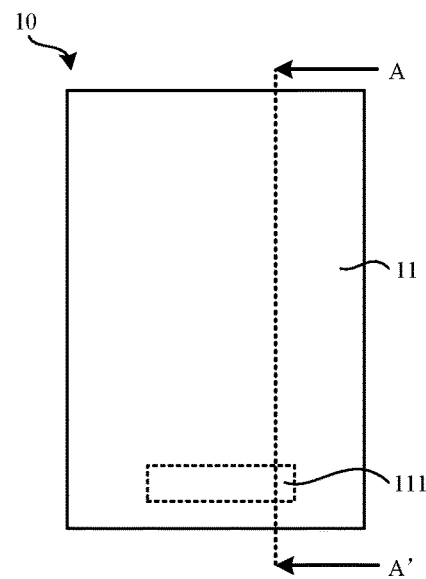
FIG. 1 is a schematic top plan view of a driver substrate provided by the present application.
Figure 2:
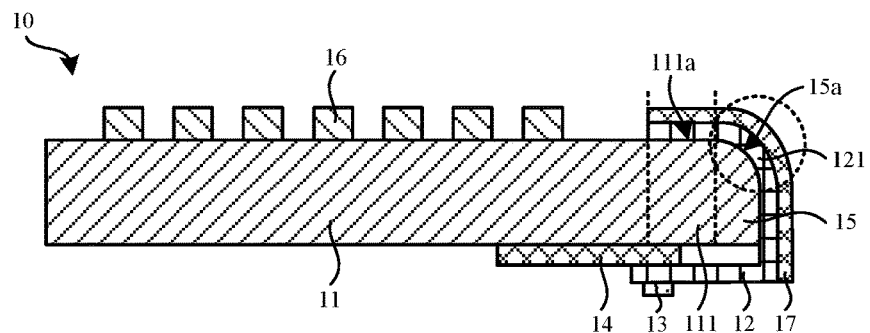
FIG. 2 is a schematic cross-sectional view of the driver substrate taken along line A-A' of FIG. 1 of a first embodiment.

Please refer to FIGS. 1 and 2. A driver substrate 10 is provided by a first embodiment of the present application. The driver substrate 10 includes a base substrate 11, a flexible circuit board 12, a driver chip 13, and an external circuit board 14. The base substrate 11 includes a first bonding portion 111. The flexible circuit board 12 is disposed on a bonding surface 111a of the first bonding portion 111 and bends from the bonding surface 111a to a side of the first bonding portion 111 away from the bonding surface 111a. The flexible circuit board 12 includes a bent portion 121. An anti-scratch structure 15 is disposed between the bent portion 121 and the first bonding portion 111. The bent portion 121 is attached to the anti-scratch structure 15. Each of the driver chip 13 and the external circuit board 14 is disposed on the side of the first bonding portion 111 away from the bonding surface 111a. The driver chip 13 is disposed on an end of the flexible circuit board 12 and is configured to provide driving signals to the flexible circuit board 12. The external circuit board 14 is configured to provide control signals and to transmit the control signals to the flexible circuit board 12 to achieve display by driving.

In this embodiment, the base substrate 11 is a rigid base substrate. The rigid base substrate may be glass. A plurality of LED chips 16 are provided on the base substrate 11. The LED chips 16 are located in a light-emitting area formed on the base substrate 11 and are configured to provide a light source for the driver substrate 10, wherein the LED chips 16 may be mini LED chips or micro LEDs.

In this embodiment, the driver substrate 10 further includes a protection layer 17 configured to protect the flexible circuit board 12. Specifically, the protection layer 17 protects a bonding part of the flexible circuit board 12 from water and oxygen, and also serves to provide protection for the flexible circuit board 12 from external scratches. Specifically, the protection layer 17 may be made of a resin material, such as epoxy resin or acrylic resin, etc. A material of the protection layer 17 is not specifically limited in this application.

Specifically, a surface of the anti-scratch structure 15 adjacent to the bent portion 121 is a curved surface. In this embodiment, the surface of the anti-scratch structure 15 adjacent to the bent portion 121 is an arc surface 15a.

In conventional driver substrates, bonding surfaces of substrates adjoin side surfaces of the substrates, and an angle between the bonding surfaces and the side surfaces is a right angle. As a result, when bending flexible circuit boards, bent portions of the flexible circuit boards and the substrates are in contact with each other in a way of point contact, causing flexible circuits at the contact point to be easily scratched by the substrates, thereby significantly reducing signal transmission performance of the flexible circuit boards, and increasing risk of poor display of display panels.

In respect of the above-mentioned technical problems existing in the prior art, by forming the surface of the anti-scratch structure 15 adjacent to the bent portion 121 as the arc surface 15a, the embodiment creates a surface contact between the bent portion 121 and the anti-scratch structure 15 and enables the bent portion 121 to smoothly transition from the bonding surface 111a to the arc surface 15a, thereby effectively reducing the risk of scratches occurred when the flexible circuit board 12 is bent.

It should be noted that the greater a curvature of the arc surface 15a is, the lower the risk of scratches is when the flexible circuit board 12 is bent. A specific size of the curvature of the arc surface 15a can be set according to a size of the anti-scratch structure 15, which is not specifically limited in this application.

In this embodiment, the anti-scratch structure 15 and the base substrate 11 are integrally formed. In an actual process, an edging process is performed on the surface of the anti-scratch structure 15 by using whetstones to form the smooth arc surface 15a. In some embodiments, processes such as laser cutting or polishing may also be used to form the anti-scratch structure 15 having the arc surface 15a. This application does not specifically limit a method of forming the arc surface 15a.

It should be noted that since the anti-scratch structure 15 and the base substrate 11 are integrally formed, in the above-mentioned edging process, it is necessary to bypass peripheral wirings in a non-light-emitting area of the driver substrate 10 when performing the edging process, thereby preventing a process of driving the light-emitting area from being adversely affected.

In this embodiment, the anti-scratch structure 15 is disposed between the bent portion 121 of the flexible circuit board 12 and the first bonding portion 111 of the base substrate 11, so that the bent portion 121 is attached to the anti-scratch structure 15, and the surface of the anti-scratch structure 15 adjacent to the bent portion 121 is the arc surface 15a. By forming the surface of the anti-scratch structure 15 adjacent to the bent portion 121 as the arc surface 15a, this embodiment creates a surface contact between the bent portion 121 and the anti-scratch structure 15 and enables the bent portion 121 to smoothly transition from the bonding surface 111a to the arc surface thereby effectively reducing the risk of scratches occurred when the flexible circuit board 12 is bent, helping to improve driving performance of the driver substrate 10, and improving poor display caused by damage to the flexible circuit board 12.

Figure 3:
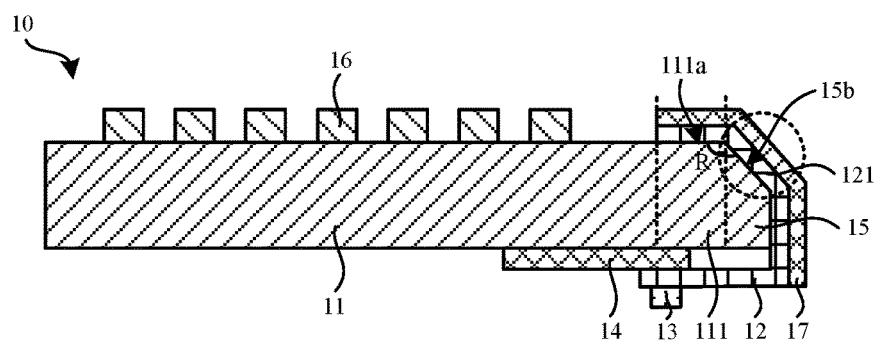
FIG. 3 is a schematic cross-sectional view of the driver substrate taken along the line A-A' of FIG. 1 of a second embodiment.

Please refer to FIG. 3. A driver substrate 10 is provided by a second embodiment of the present application. The driver substrate 10 includes a base substrate 11, a flexible circuit board 12, a driver chip 13, and an external circuit board 14. The base substrate 11 includes a first bonding portion 111. The flexible circuit board 12 is disposed on a bonding surface 111a of the first bonding portion 111 and bends from the bonding surface 111a to the side of the first bonding portion 111 away from the bonding surface 111a. The flexible circuit board 12 includes a bent portion 121. An anti-scratch structure is disposed between the bent portion 121 and the first bonding portion 111. The bent portion 121 is attached to the anti-scratch structure 15. Each of the driver chip 13 and the external circuit board 14 is disposed on the side of the first bonding portion 111 away from the bonding surface 111a. The driver chip 13 is disposed on an end of the flexible circuit board 12 and is configured to control signals to the flexible circuit board 12 to achieve in-plane driving.

In this embodiment, the base substrate 11 is a rigid base substrate. The rigid base substrate may be glass. A plurality of LED chips 16 are provided on the base substrate 11. The LED chips 16 are located in a light-emitting area formed on the base substrate 11 and are configured to provide a light source for the driver substrate 10, wherein the LED chips 16 may be mini LED chips or micro LEDs.

In this embodiment, the driver substrate 10 further includes a protection layer 17 configured to protect the flexible circuit board 12. Specifically, the protection layer 17 protects a bonding part of the flexible circuit board 12 from water and oxygen, and also serves to provide protection for the flexible circuit board 12 from external scratches. Specifically, the protection layer 17 may be made of a resin material, such as epoxy resin or acrylic resin, etc. A material of the protection layer 17 is not specifically limited in this application.

Specifically, a surface of the anti-scratch structure 15 adjacent to the bent portion 121 is a flat surface 15b. The flat surface 15b adjoins the bonding surface 111a and is located at an angle R greater than 90 degrees and less than 180 degrees with respect to the bonding surface 111a. Specifically, the angle R may be 95 degrees, 100 degrees, 120 degrees, 125 degrees, or 150 degrees, etc. A specific value of the angle R can be selected according to actual application requirements, which is not limited in this application.

In conventional driver substrates, bonding surfaces of substrates adjoin side surfaces of the substrates, and an angle between the bonding surfaces and the side surfaces is a right angle. As a result, when bending flexible circuit boards, bent portions of the flexible circuit boards and the substrates are in contact with each other in a way of point contact, causing flexible circuits at the contact point to be easily scratched by the substrates, thereby significantly reducing signal transmission performance of the flexible circuit boards, and increasing risk of poor display of the display panels.

In respect of the above-mentioned technical problems existing in the prior art, the present embodiment, by forming the surface of the anti-scratch structure 15 adjacent to the bent portion 121 as the flat surface 15b and making the angle R between the flat surface 15b and the bonding surface 111a greater than 90 degrees and less than 180 degrees, can reduce the risk of scratches on the bent portion 121 of the flexible circuit board 12 when bending in comparison to the prior art. In addition, the above-mentioned configuration can also reduce difficulty in implementation of a process, which is beneficial to saving process cost.

In this embodiment, the anti-scratch structure 15 and the base substrate 11 are integrally formed. In an actual process, an edging process is performed on the surface of the anti-scratch structure 15 by using whetstones to form a smooth flat surface 15b. In some embodiments, processes such as laser cutting, etc., may also be used to form the anti-scratch structure 15 having the flat surface 15b. This application does not specifically limit a method of forming the flat surface 15b.

It should be noted that since the anti-scratch structure 15 and the base substrate 11 are integrally formed, it is necessary to bypass peripheral wirings in a non-light-emitting area of the driver substrate 10 when performing the edging process, thereby preventing a process of driving the light-emitting area from being adversely affected.

By forming the surface of the anti-scratch structure 15 adjacent to the bent portion 121 as the flat surface 15b and making the angle R between the flat surface 15b and the bonding surface 111a greater than 90 degrees and less than 180 degrees, this embodiment effectively reduces the risk of scratches when the flexible circuit board 12 is bent, helps to enhance driving performance of the driver substrate 10, and alleviates poor display caused by the damage to the flexible circuit board 12. In addition, the above-mentioned configuration can also reduce difficulty in implementation of a process, which is beneficial to lower the process cost.

Figure 4:
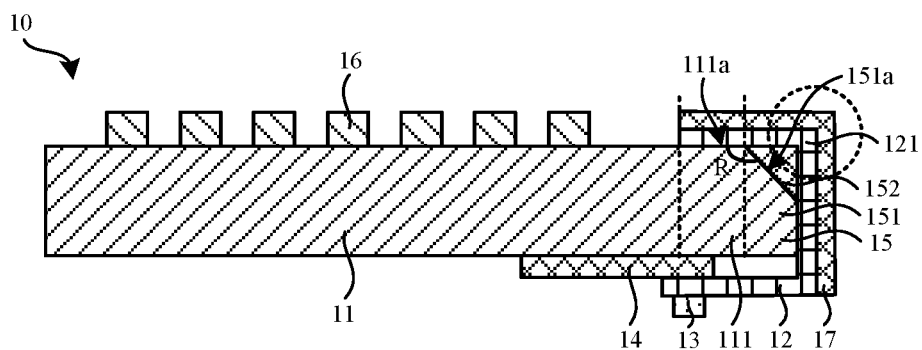
FIG. 4 is a schematic cross-sectional view of the driver substrate taken along the line A-A' of FIG. 1 of a third embodiment.

Please refer to FIG. 4. A driver substrate 10 is provided by a third embodiment of the present application. The driver substrate 10 includes a base substrate 11, a flexible circuit board 12, a driver chip 13, and an external circuit board 14. The base substrate 11 includes a first bonding portion 111. The flexible circuit board 12 is disposed on a bonding surface 111a of the first bonding portion 111 and bends from the bonding surface 111a to the side of the first bonding portion 111 away from the bonding surface 111a. The flexible circuit board 12 includes a bent portion 121. An anti-scratch structure 15 is disposed between the bent portion 121 and the first bonding portion 111. The bent portion 121 is attached to the anti-scratch structure 15. Each of the driver chip 13 and the external circuit board 14 is disposed on the side of the first bonding portion 111 away from the bonding surface 111a. The driver chip 13 is disposed on an end of the flexible circuit board 12 and is configured to provide driving signals to the flexible circuit board 12. The external circuit board 14 is configured to provide control signals and to transmit the control signals to the flexible circuit board 12 to achieve in-plane driving.

In this embodiment, the base substrate 11 is a rigid base substrate. The rigid base substrate may be glass. A plurality of LED chips 16 are provided on the base substrate 11. The LED chips 16 are located in a light-emitting area formed on the base substrate 11 and are configured to provide a light source for the driver substrate 10, wherein the LED chips 16 may be mini LED chips or micro LEDs.

In this embodiment, the driver substrate 10 further includes a protection layer 17 configured to protect the flexible circuit board 12. Specifically, the protection layer 17 protects a bonding part of the flexible circuit board 12 from water and oxygen, and also serves to provide protection for the flexible circuit board 12 from external scratches. Specifically, the protection layer 17 may be made of a resin material, such as epoxy resin or acrylic resin, etc. A material of the protection layer 17 is not specifically limited in this application.

The anti-scratch structure 15 includes a first anti-scratch portion 151 and a second anti-scratch portion 152. The second anti-scratch portion 152 is located at a side of the first anti-scratch portion 151 adjacent to the bent portion 121.

Specifically, a surface of the first anti-scratch portion 151 adjacent to the bent portion 121 is a flat surface 151a. The flat surface 151a adjoins the bonding surface 111a and is located at an angle R greater than 90 degrees and less than 180 degrees with respect to the bonding surface 111a. Specifically, the angle R may be 95 degrees, 100 degrees, 120 degrees, 125 degrees, or 150 degrees, etc. A specific value of the angle R may be selected according to actual application requirements and is not limited in this application.

In conventional driver substrates, bonding surfaces of substrates adjoin side surfaces of the substrates, and an angle between the bonding surfaces and the side surfaces is a right angle. As a result, when bending flexible circuit boards, bent portions of the flexible circuit boards and the substrates are in contact with each other in a way of point contact, causing flexible circuits at the contact point to be easily scratched by the substrates, thereby significantly reducing signal transmission performance of the flexible circuit boards, and increasing the risk of poor display of the display panels.

In respect of the above-mentioned technical problems existing in the prior art, the present embodiment, by forming the surface of the anti-scratch structure 15 adjacent to the bent portion 121 as the flat surface 151a and making the angle R between the flat surface 151a and the bonding surface 111a greater than 90 degrees and less than 180 degrees, can reduce the risk of scratches on the bent portion 121 of the flexible circuit board 12 when bending in comparison to the prior art. In addition, the above-mentioned configuration can also reduce difficulty in implementation of a process, which is beneficial to saving process cost.

In this embodiment, the first anti-scratch portion 151 and the base substrate 11 are integrally formed. In an actual process, an edging process is performed on the surface of the first anti-scratch portion 151 by using whetstones to form a smooth flat surface 151a. In some embodiments, processes such as laser cutting may also be used to form the first anti-scratch portion 151 having the flat surface 151a. This application does not specifically limit a method of forming the flat surface.

It should be noted that since the first anti-scratch portion 151 and the base substrate 11 are integrally formed, it is necessary to bypass peripheral wirings in a non-light-emitting area of the driver substrate 10 when performing the edging process, thereby preventing a process of driving the light-emitting area from being adversely affected.

The second anti-scratch portion 152 is disposed on the flat surface 151a of the first anti-scratch portion 151. The bent portion 121 is attached to the second anti-scratch portion 152. The second anti-scratch portion 152 has an elastic modulus less than an elastic modulus of the first anti-scratch portion 151.

By providing the second anti-scratch portion 152 disposed between the first anti-scratch portion 151 and the bent portion 121 and making the elastic modulus of the second anti-scratch portion 152 less than the elastic modulus of the first anti-scratch portion 151, the second anti-scratch portion 152 in comparison to the first anti-scratch portion 151 has better deformability, which can further mitigate the risk of scratches at a contact area between the bent portion 121 of the flexible circuit board and the first anti-scratch portion 151.

Specifically, the second anti-scratch portion 152 may be made of a hard material or a flexible material. In this embodiment, a material of the second anti-scratch portion 152 is a flexible material.

Specifically, the second anti-scratch portion 152 is a lubricating layer. A surface of the lubricating layer is smooth. The lubricating layer may be made of a lubricant material with certain adhesiveness, such as varnish. In this manner, by using the lubricating layer, it not only reduces the risk of scratches on the flexible circuit board 12, but also improves adhesion between the bent portion 121 of the flexible circuit board 12 and the first anti-scratch portion 151, thereby preventing driving performance of the flexible circuit board 12 from being affected due to loosening caused by poor adhesion between the flexible circuit board 12 and the first anti-scratch portion 151.

In this embodiment, the second anti-scratch portion 152 is right triangle in shape in cross-section in a direction perpendicular to a plane on which the base substrate 11 is located, wherein a right-angle portion of the right triangle is in contact with the bent portion 121. Surfaces of the second anti-scratch portion 152 adjacent to the bent portion 121 are flush with the bonding surface 111a and a side surface of the base substrate 11, respectively.

In an actual process, the second anti-scratch portion 152 is formed on the flat surface 151a of the first anti-scratch portion 151 by printing, stamping, coating, or spraying.

By forming the surface of the first anti-scratch portion 151 adjacent to the bent portion 121 as the flat surface 151a, making the angle R between the flat surface 151a and the bonding surface 111a greater than 90 degrees and less than 180 degrees, and forming the second anti-scratch portion 152 as the lubricating layer, the present embodiment not only reduces the risk of scratches on the flexible circuit board 12, but also improves the adhesion between the bent portion 121 of the flexible circuit board 12 and the first anti-scratch portion 151, thereby preventing the driving performance of the flexible circuit board 12 from being affected due to loosening of the flexible circuit board 12.

Figure 5:
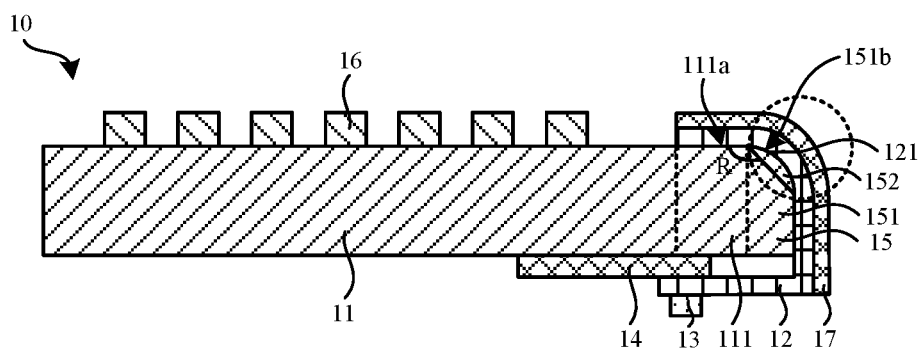
FIG. 5 is a schematic cross-sectional view of the driver substrate taken along the line A-A' of FIG. 1 of a fourth embodiment.

Please refer to FIG. 5. A driver substrate 10 provided by a fourth embodiment of the present application is different from the third embodiment in that a surface of the second anti-scratch portion 152 adjacent to the bent portion 121 is an arc surface 151b.

By forming the surface of the second anti-scratch portion 152 adjacent to the bent portion 121 as the arc surface 151b, the present embodiment may further reduce the risk of scratches on the bent portion 121 of the flexible circuit board 12. In addition, the above-mentioned configuration reduces requirements for a shape of the second anti-scratch portion 152, thereby helping to reduce difficulty in operation, so as to lower the process cost.

Figure 6:
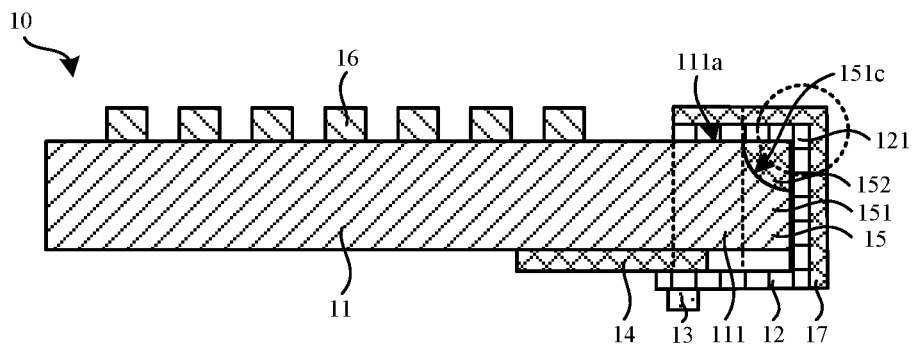
FIG. 6 is a schematic cross-sectional view of the driver substrate taken along the line A-A' of FIG. 1 of a fifth embodiment.

Please refer to FIG. 6. A driver substrate 10 is provided by a fifth embodiment of the present application. The driver substrate 10 includes a base substrate 11, a flexible circuit board 12, a driver chip 13, and an external circuit board 14. The base substrate 11 includes a first bonding portion 111. The flexible circuit board 12 is disposed on a bonding surface 111a of the first bonding portion 111 and bends from the bonding surface 111a to the side of the first bonding portion 111 away from the bonding surface 111a. The flexible circuit board 12 includes a bent portion 121. An anti-scratch structure 15 is disposed between the bent portion 121 and the first bonding portion 111, and the bent portion 121 is attached to the anti-scratch structure 15. The driver chip 13 is disposed on an end of the flexible circuit board 12 and is configured to provide driving signals to the flexible circuit board 12. The external circuit board 14 is configured to provide control signals and to transmit the control signals to the flexible circuit board 12 to achieve in-plane driving.

In this embodiment, the base substrate 11 is a rigid base substrate. The rigid base substrate may be glass. A plurality of LED chips 16 are provided on the base substrate 11. The LED chips 16 are located in a light-emitting area formed on the base substrate 11 and are configured to provide a light source for the driver substrate 10, wherein the LED chips 16 may be mini LED chips or micro LEDs.

In this embodiment, the driver substrate 10 further includes a protection layer 17 configured to protect the flexible circuit board 12. Specifically, the protection layer 17 protects a bonding part of the flexible circuit board 12 from water and oxygen, and also serves to provide protection for the flexible circuit board 12 from external scratches. Specifically, the protection layer 17 may be made of a resin material, such as epoxy resin or acrylic resin, etc. A material of the protection layer 17 is not specifically limited in this application.

The anti-scratch structure 15 includes a first anti-scratch portion 151 and a second anti-scratch portion 152. The second anti-scratch portion 152 is located at a side of the first anti-scratch portion 151 adjacent to the bent portion 121.

Specifically, a recess 151c is formed on a side of the first anti-scratch portion 151 adjacent to the second anti-scratch portion 152. The second anti-scratch portion 152 is filled in the recess 151c. The bent portion 121 is attached to the second anti-scratch portion 152, and the second anti-scratch portion 152 has an elastic modulus less than an elastic modulus of the first anti-scratch portion 151.

In this embodiment, the first anti-scratch portion 151 and the base substrate 11 are in integrally formed. In an actual process, an edging process is performed on a surface of the first anti-scratch portion 151 by using whetstones to form the recess 151c on the first anti-scratch portion 151. In some embodiments, processes such as laser cutting, etc., may also be used to form the first anti-scratch structure 151 having the recess 151c. This application does not specifically limit a method of forming the recess.

It should be noted that since the first anti-scratch portion 151 and the base substrate 11 are integrally formed, it is necessary to bypass peripheral wirings in a non-light-emitting area of the driver substrate 10 when performing the edging process, thereby preventing a process of driving the light-emitting area from being adversely affected.

Further, by providing the second anti-scratch portion 152 disposed in the recess 151c of the first anti-scratch portion 151 and making the elastic modulus of the second anti-scratch portion 152 less than the elastic modulus of the first anti-scratch portion 151, the second anti-scratch portion 152 in comparison to the first anti-scratch portion 151 has better deformability, which can further mitigate the risk of scratches at a contact area between the bent portion 121 of the flexible circuit board and the first anti-scratch portion 151.

Specifically, the second anti-scratch portion 152 may be made of a hard material or a flexible material. In this embodiment, a material of the second anti-scratch portion 152 is a flexible material.

Specifically, the second anti-scratch portion 152 is a lubricating layer. A surface of the lubricating layer is smooth. The lubricating layer may be made of a lubricating material with a certain adhesiveness, such as varnish. In this manner, by using the lubricating layer, it not only reduces the risk of scratches on the flexible circuit board 12, but also improves adhesion between the bent portion 121 of the flexible circuit board 12 and the first anti-scratch portion 151, thereby preventing driving performance of the flexible circuit board 12 from being affected due to loosening caused by poor adhesion between the flexible circuit board 12 and the first anti-scratch portion 151.

In an actual process, the second anti-scratch portion 152 is formed in the recess 151c of the first anti-scratch portion 151 by printing, stamping, coating, or spraying.

By forming the recess 151c on the side of the first anti-scratch portion 151 adjacent to the bent portion 121, filling the recess 151c with the second anti-scratch portion 152, and making the elastic modulus of the second anti-scratch portion 152 less than the elastic modulus of the first anti-scratch portion 151, the present embodiment not only reduces the risk of scratches on the flexible circuit board 12, but also improves the adhesion between the bent portion 121 of the flexible circuit board 12 and the first anti-scratch portion 151, thereby preventing the driving performance of the flexible circuit board 12 from being affected due to loosening of the flexible circuit board 12.

Figure 7:
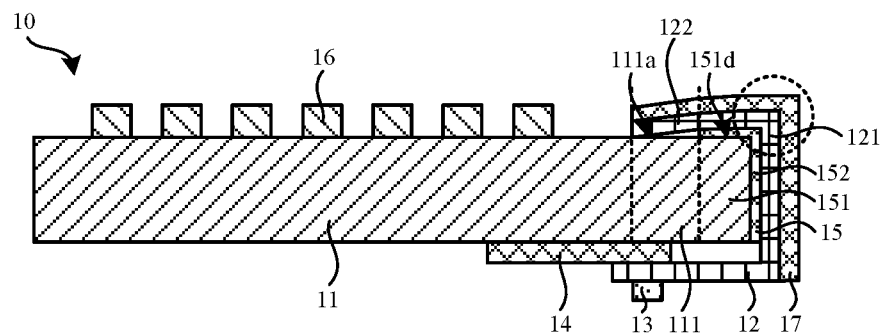
FIG. 7 is a schematic cross-sectional view of the driver substrate taken along the line A-A' of FIG. 1 of a sixth embodiment.

Please refer to FIG. 7. A driver substrate 10 is provided by a sixth embodiment of the present application. The driver substrate 10 includes a base substrate 11, a flexible circuit board 12, a driver chip 13, and an external circuit board 14. The base substrate 11 includes a first bonding portion 111. The flexible circuit board 12 is disposed on a bonding surface 111a of the first bonding portion 111 and bends from the bonding surface 111a to the side of the first bonding portion 111 away from the bonding surface 111a. The flexible circuit board 12 includes a bent portion 121. An anti-scratch structure 15 is disposed between the bent portion 121 and the first bonding portion 111. The bent portion 121 is attached to the anti-scratch structure 15. Each of the driver chip 13 and the external circuit board 14 is disposed on the side of the first bonding portion 111 away from the bonding surface 111a. The driver chip 13 is disposed on an end of the flexible circuit board 12 and is configured to provide driving signals to the flexible circuit board 12. The external circuit board 14 is configured to provide control signals and to transmit the control signals to the flexible circuit board 12 to achieve in-plane driving.

In this embodiment, the base substrate 11 is a rigid base substrate. The rigid base substrate may be glass. A plurality of LED chips 16 are provided on the base substrate 11. The LED chips 16 are located in a light-emitting area formed on the base substrate 11 and are configured to provide a light source for the driver substrate 10, wherein the LED chips 16 may be mini LED chips or micro LEDs.

In this embodiment, the driver substrate 10 further include a protection layer 17 configured to protect the flexible circuit board 12. Specifically, the protection layer 17 protects a bonding part of the flexible circuit board 12 from water and oxygen, and also serves to provide protection for the flexible circuit board 12 from external scratches. Specifically, the protection layer 17 may be made of a resin material, such as epoxy resin or acrylic resin, etc. A material of the protection layer 17 is not specifically limited in this application.

In this embodiment, the anti-scratch structure 15 includes a base portion 151 and an anti-scratch portion 152. The anti-scratch portion 152 is located at a side of the base portion 151 adjacent to the bent portion 121. The base portion 151 has a transition surface 151d adjoining the bonding surface 111a. The anti-scratch portion 152 covers the transition surface 151d and bends from the transition surface 151d to a side of the base portion 151. The bent portion 121 is attached to the anti-scratch portion 152. The anti-scratch portion 152 has an elastic modulus less than an elastic modulus of the base portion 151.

Specifically, the anti-scratch portion 151 and the base substrate 11 are integrally formed. Before the flexible circuit board 12 is bonded, the base portion 151 is an edge portion of the base substrate 11 close to a bonding area. In this embodiment, there is no need to perform an edging process on the base portion 151. After the LED chips 16 and a corresponding peripheral wiring are formed on the base substrate 11 (including the base portion 151), the second anti-scratch portion 152 is directly formed on the base portion 151, and then proceed to bond the flexible circuit board 12.

The above-mentioned configuration provides the anti-scratch portion 152 disposed between the base substrate 11 and the bent portion 121 of the flexible circuit board 12 and makes the elastic modulus of the anti-scratch portion 152 less than the elastic modulus of the base portion 151. Due to the integral formation of the base portion 151 and the base substrate 11, the anti-scratch portion 152 in comparison to the baes substrate 11 has better deformability, which can mitigate the risk of scratches at a contact area between the bent portion 121 of the flexible circuit board 12 and the base portion 151.

Specifically, the anti-scratch portion 152 may be made of a hard material or a flexible material. In this embodiment, a material of the anti-scratch portion 152 is a flexible material. In an actual process, the anti-scratch portion 152 is formed on the surface of the base portion 151 by printing, stamping, coating, or spraying.

In this embodiment, the anti-scratch portion 152 is a lubricating layer. A surface of the lubricating layer is smooth. The lubricating layer may be made of a lubricating material with certain adhesiveness, such as varnish. In this manner, by using the lubricating layer, it not only reduces the risk of scratches on the flexible circuit board 12, but also improves adhesion between the bent portion 121 of the flexible circuit board 12 and the base portion 151, thereby preventing driving performance of the flexible circuit board 12 from being affected due to loosening caused by poor adhesion between the flexible circuit board 12 and the anti-scratch portion 152.

In this embodiment, the flexible circuit board 12 further includes a second bonding portion 122 disposed on the bonding surface 111a and adjoining the bent portion 121. Part of the anti-scratch portion 152 on the transition surface 151d has a uniform thickness in a direction perpendicular to a plane on which the bonding surface 111a is located and in a direction from away from the second bonding portion 122 to close to the second bonding portion 122.

Specifically, the anti-scratch portion 152 has a thickness between 1 micron (μm) and 100 μm, such as 1 μm, 10 μm, 25 μm, 50 μm, 75 μm, or 100 μm. A specific thickness of the anti-scratch portion 152 may be selected according to actual process conditions and application requirements and is not limited in this application.

Figure 8:
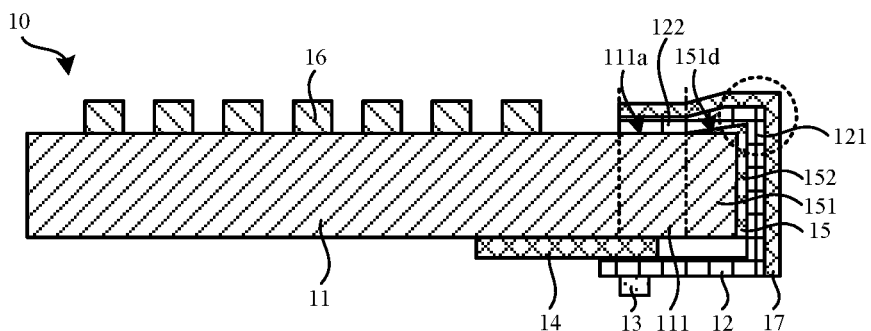
FIG. 8 is a schematic cross-sectional view of the driver substrate taken along the line A-A' of FIG. 1 of a seventh embodiment.

Please refer to FIG. 8. A driver substrate 10 provided by a seventh embodiment of the present application is different from the sixth embodiment in that the anti-scratch portion 152 gradually increases in thickness on the transition surface 151d in the direction perpendicular to the plane on which the bonding surface 111a is located and in the direction from away from the second bonding portion 122 to close to the second bonding portion 122.

The above-mentioned configuration enables the second bonding portion 122 to smoothly transition from the bonding surface 111a to the transition surface 151d, so as to reduce the risk of scratches on the flexible circuit board 12 as well as prevent the bonding between the first bonding portion 111 and the second bonding portion 122 from being affected due to the provision of the anti-scratch portion 152.

Figure 9:
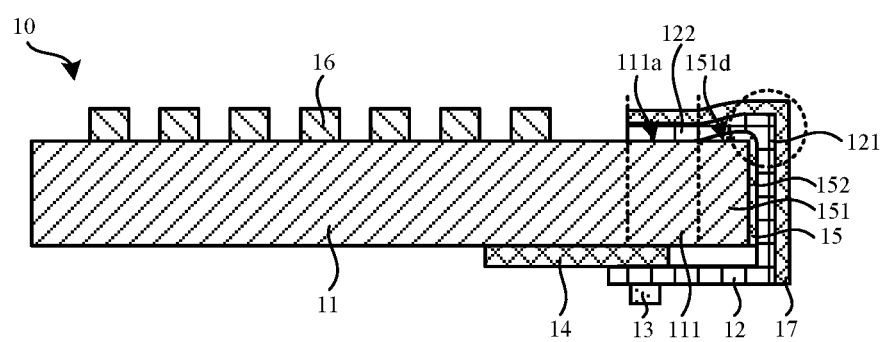
FIG. 9 is a schematic cross-sectional view of the driver substrate taken along the line A-A' of FIG. 1 of an eighth embodiment.

Please refer to FIG. 9. A driver substrate 10 provided by an eighth embodiment of the present application is different from the seventh embodiment in that a surface of the anti-scratch portion 152 adjacent to the bent portion 121 is a curved surface.

The above-mentioned configuration may further lower the risk of scratches on the flexible circuit board 12 and reduce requirements for coating shape of the anti-scratch portion 152, so that not only a situation of the poor display is improved, but also difficulty in implementation of a process is reduced, thereby lowering process cost.

An embodiment of the present application further provides a display panel, including a driver substrate. The driver substrate may be the driver substrate 10 described in any of the foregoing embodiments, or may be a panel formed by splicing at least two driver substrates 10 together. For the specific structure of the driver substrate 10, reference may be made to the description of the above embodiments, which will not be repeated here.

Compared to driver substrates in the prior art, a driver substrate provided by the present application employs an anti-scratch structure disposed between a bent portion of a flexible circuit board and a first bonding portion of a base substrate and makes the bent portion attached to the anti-scratch structure, so as to reduce the risk of scratches caused by a direct contact between the bent portion of the flexible circuit board and the base substrate, thereby improving the situation of poor display caused by damage to the flexible circuit board.

The driver substrate and the display panel provided by the embodiments of the present application are described in detail above. Specific examples are used in this article to explain the principles and implementation of this application. The descriptions of the above embodiments are only used to help understand the technical solutions and core ideas of this application. Also, for those skilled in the art, according to the idea of this application, there will be changes in the specific implementation and application scope. In summary, the content of this application should not be construed as a limitation on this application.

What is claimed is:

1. A driver substrate comprising:
   a base substrate comprising a first bonding portion; and
   a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure;
   wherein the anti-scratch structure comprises a base portion and an anti-scratch portion, wherein the base portion and the base substrate are in integral formation with each other, the anti-scratch portion is disposed on a side of the base portion adjacent to the bent portion, the bent portion is attached to the anti-scratch portion, and the anti-scratch portion has an elastic modulus less than an elastic modulus of the base portion.

2. The driver substrate of claim 1, wherein a surface of the anti-scratch structure adjacent to the bent portion is a curved surface.

3. The driver substrate of claim 2, wherein the surface of the anti-scratch structure adjacent to the bent portion is an arc surface.

4. The driver substrate of claim 1, wherein the anti-scratch portion is a lubricating layer.

5. The driver substrate of claim 1, wherein the base portion has a transition surface adjoining the bonding surface, and the anti-scratch portion covers the transition surface and bends from the transition surface to a side of the base portion.

6. The driver substrate of claim 5, wherein the flexible circuit board further comprises a second bonding portion disposed on the bonding surface and adjoining the bent portion, wherein the anti-scratch portion gradually increases in thickness on the transition surface in a direction perpendicular to a plane on which the bonding surface is located and in a direction from away from the second bonding portion to close to the second bonding portion.

7. The driver substrate of claim 1, further comprising:
   a driver chip disposed on the side of the first bonding portion away from the bonding surface and located at an end of the flexible circuit board; and
   an external circuit board disposed on the side of the first bonding portion away from the bonding surface and configured to transmit control signals to the flexible circuit board.

8. A display panel comprising the driver substrate as claimed in claim 1.

9. The display panel of claim 8, wherein a surface of the anti-scratch structure adjacent to the bent portion is a curved surface.

10. The display panel of claim 8, wherein the base portion has a transition surface adjoining the bonding surface, and the anti-scratch portion covers the transition surface and bends from the transition surface to a side of the base portion.

11. The display panel of claim 10, wherein the flexible circuit board further comprises a second bonding portion disposed on the bonding surface and adjoining the bent portion, wherein the anti-scratch portion gradually increases in thickness on the transition surface in a direction perpendicular to a plane on which the bonding surface is located and in a direction from away from the second bonding portion to close to the second bonding portion.

12. The display panel of claim 8, wherein the surface of the anti-scratch structure adjacent to the bent portion is an arc surface.

13. The display panel of claim 8, wherein the anti-scratch portion is a lubricating layer.

14. A driver substrate comprising:
  a base substrate comprising a first bonding portion; and
  a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure;
  wherein the anti-scratch structure comprises a first anti-scratch portion and a second anti-scratch portion, and the second anti-scratch portion is located at a side of the first anti-scratch portion adjacent to the bent portion; and a recess is defined on a side of the first anti-scratch portion adjacent to the second anti-scratch portion, the second anti-scratch portion is filled in the recess, the bent portion is attached to the second anti-scratch portion, and the second anti-scratch portion has an elastic modulus less than an elastic modulus of the first anti-scratch portion.

15. The driver substrate of claim 14, wherein the first anti-scratch portion and the base substrate are in integral formation with each other.

16. A driver substrate comprising:
  a base substrate comprising a first bonding portion; and
  a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure;
  wherein the anti-scratch structure comprises a first anti-scratch portion and a second anti-scratch portion, a surface of the first anti-scratch portion adjacent to the bent portion is a flat surface, the second anti-scratch portion is disposed on the flat surface of the first anti-scratch portion, the bent portion is attached to the second anti-scratch portion, and the second anti-scratch portion has an elastic modulus less than an elastic modulus of the first anti-scratch portion.

17. The driver substrate of claim 16, wherein the flat surface adjoins the bonding surface and is located at an angle greater than 90 degrees and less than 180 degrees with respect to the bonding surface.

18. The driver substrate of claim 16, wherein a surface of the second anti-scratch portion adjacent to the bent portion is an arc surface.

19. A driver substrate comprising:
  a base substrate comprising a first bonding portion; and
  a flexible circuit board disposed on a bonding surface of the first bonding portion and bending from the bonding surface to a side of the first bonding portion away from the bonding surface, wherein the flexible circuit board comprises a bent portion, an anti-scratch structure is disposed between the bent portion and the first bonding portion, and the bent portion is attached to the anti-scratch structure;
  wherein the anti-scratch structure comprises a first anti-scratch portion and a second anti-scratch portion, and the second anti-scratch portion is located at a side of the first anti-scratch portion adjacent to the bent portion; the first anti-scratch portion and the base substrate are in integral formation with each other; the bent portion is attached to the anti-scratch portion; and the anti-scratch portion is a lubricating layer.

20. The driver substrate of claim 19, wherein a surface of the anti-scratch structure adjacent to the bent portion is a curved surface or an arc surface.

* * * * *